United States Patent [19]

Kimura et al.

[11] Patent Number: 4,570,072
[45] Date of Patent: Feb. 11, 1986

[54] ELECTROMAGNETIC LENS POLEPIECE STRUCTURE

[75] Inventors: Chikara Kimura, Katsuta; Keiji Yada, Sendai, both of Japan

[73] Assignee: Hitachi, Ltd., Tokyo, Japan

[21] Appl. No.: 458,058

[22] Filed: Jan. 14, 1983

[30] Foreign Application Priority Data

Jan. 18, 1982 [JP] Japan .................................. 57-6443

[51] Int. Cl.[4] .............................................. H01J 3/12
[52] U.S. Cl. .............................. 250/396 ML; 250/397
[58] Field of Search ................ 250/396, 396 ML, 397, 250/310, 311

[56] References Cited

U.S. PATENT DOCUMENTS 2,910,603 10/1959 Van Dorsten et al. ......... 250/396 X
4,440,475 4/1984 Colliaux ......................... 250/310 X Primary Examiner—Alfred E. Smith
Assistant Examiner—Jack I. Berman
Attorney, Agent, or Firm—Antonelli, Terry & Wands

[57] ABSTRACT

Disclosed is an electromagnetic lens polepiece structure for use in an electron microscope comprising an upper polepiece and an opposite lower polepiece, each having a lens bore, wherein the lens bore portion of the upper polepiece protrudes toward the lens bore of the lower polepiece. The protrudant lens bore portion allows the provision of an X-ray conducting bore for the measurement without disturbing the magnetic field of the lens. This makes it possible a smaller lens bore and, consequently, the spherical aberration is reduced and the resolution of the microscope is improved. The protrudant lens bore structure allows the upper polepiece to be divided into two sections so that the bore section can be replaced easily for the measurement of X-rays.

12 Claims, 2 Drawing Figures

ELECTROMAGNETIC LENS POLEPIECE STRUCTURE

BACKGROUND AND SUMMARY OF THE INVENTION

The present invention relates to an electromagnetic lens polepiece structure and, particularly, to an electromagnetic lens polepiece structure suitable for use as an objective lens polepiece structure of an electron microscope.

The electron microscope is now not only used for the observation of a magnified electron image for a specimen as a visible image on the fluorescent screen, but used for the elementary analysis of a specimen by detecting X-rays emitted from the specimen exposed to the electron beam.

The specimen in usually placed in a narrow room between the upper polepiece and the lower polepiece of the objective, and therefore it is difficult to conduct X-rays created by exposure of the specimen to the electron beam out of the objective.

One known method for coping with this problem is to tilt the specimen against the electron beam axis only during the X-ray detection so that X-rays emitted from the specimen are taken out of the objective through a room between the upper and lower polepieces. This method, however, poses a problem that X-rays are detected in different conditions from those of the microscopic observation and also another problem that secondary electrons emitted from the specimen and moved by the magnetic field of the objective upward along the electron beam axis in a spiral motion impinge on the specimen, causing the creation of X-rays which are detected as a background.

Although these problems can be solved by retaining the specimen on a plane parpendicular to the electron beam axis during the X-ray detection, it is practically difficult to take out X-rays to be detected through a room between the upper and lower polepieces. This is because the gap between the upper and lower polepieces is too narrow for the detection of X-rays emitted from the specimen.

On this account, the upper polepiece is usually provided with a large opening for the lens (10 mm or more in diameter) so that X-rays are taken out through this bore. However, this causes an increased spherical aberration of the objective lens, resulting in a deteriorated resolution, since the spherical aberration increases in proportion to the bore size of the polepiece.

It is an object of the present invention to provide an electromagnetic lens polepiece structure which reduces the spherical aberration and, as a result, improves the resolution.

The present invention resides in the provision of an electromagnetic lens comprising an upper polepiece having a lens bore and a lower polepiece confronting the upper polepiece and having a lens bore, with the lens section of the upper polepiece protruding toward the lens bore of the lower polepiece.

According to the experimental study by the inventors, it was found that if the above-mentioned protrudant lens bore is absent, but an opening for taking out X-rays is provided separately in the upper polepiece, the astigmatism increases beyond a negligible degree, whereas in the arrangement with the protrudant lens bore, even with an opening for taking out X-rays in addition to the lens bore so far as the opening is formed in another portion that of the protrudant lens bore of the upper polepiece, the magnetic field for the lens to be formed between the lens bore of the upper polepiece and the lens bore of the lower polepiece is not disturbed by the opening for taking out X-rays, and consequently, the astigmatism does not arise substantially.

Accordingly, the protrudant lens bore does not need to be used as an opening for taking out X-rays, allowing a smaller lens bore, and in consequence, the spherical aberration which causes a deteriorated resolution can be reduced.

These and other objects, features and advantages of the present invention will become more apparent from the following detailed description taken in conjunction with the accompanying drawings.

DESCRIPTION OF THE PREFERRED EMBODIMENTS

Figure 1:
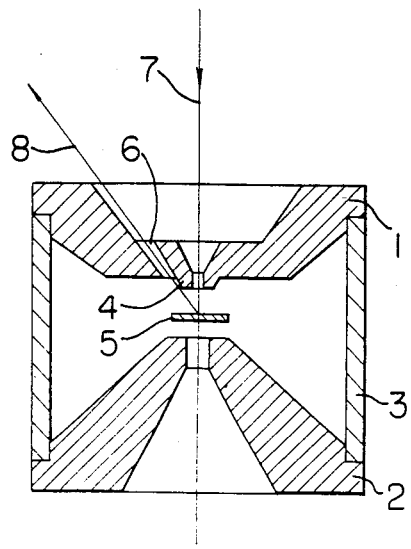
FIG. 1 is a longitudinal cross-sectional view showing one embodiment of the present invention.

In the first embodiment shown in FIG. 1, an upper polepiece 1 and an opposite lower polepiece 2 are integrated through a spacer 3 made of nonmagnetic material. In the central portions of the upper polepiece 1 and lower polepiece 2, there are formed respective lens bores. The lens bore portion of the upper polepiece 1 is shaped in a tapered protrusion projecting toward the lens bore of the lower polepiece 2. The protrudant lens bore portion is shown by reference number 4 in FIG. 1.

Although, in actuality, there are provided an excitation winding and magnetic path member for producing a magnetic field for the lens between the lens bore of the upper polepiece 1 and the lens bore of the lower polepiece 2, they are not shown in FIG. 1 for purposes of simplicity.

A specimen 5 is placed between the upper polepiece 1 and the lower polepiece 2, i.e., in the magnetic field of the lens. The upper polepiece 1 has a portion, other than the protrudant lens bore portion 4, provided with one or more than one bores 6 for taking out X-rays. Thus, X-ray 8 which is created when the specimen 5 is hit by the electron beam on the electron beam axis 7 is taken out through the bore 6.

According to the experimental study by the inventors, when an polepiece structure shown in FIG. 1 was used as an objective polepiece structure for the electron microscope, the magnetic field of the lens which acts on the electron beam on the axis 7 was not disturbed even in the presence of the X-ray conducting bore 6 so far as the protrudant lens bore portion 4 was provided, and consequently, the astigmatism did not arise.

Accordingly, the embodiment of FIG. 1 does not need to use the lens bore in the upper polepiece 1 for taking out X-rays, allowing the lens bore to be formed much smaller and, in consequence, the spherical aberration is reduced and the resolution is improved.

According to the experimental study by the inventors, when the lens bore in the upper polepiece 1 was reduced from 10 mm to 2 mm in diameter, the spherical aberration coefficient was reduced to approximately ⅛ and the resolution (point resolution) was improved from around 4.5 Å to around 3 Å.

In addition, according to the experimental study by the inventors, it was found that the astigmatism does not arise substantially when the protrudant lens bore portion 4 is shaped to have an outer diameter at the tip larger than the diameter at the bottom of the lens bore, but smaller than substantially three times that diameter, and at the same time the dimension of protrusion of the lens bore portion 4 is substantially larger than the outer diameter of the tip.

Figure 2:
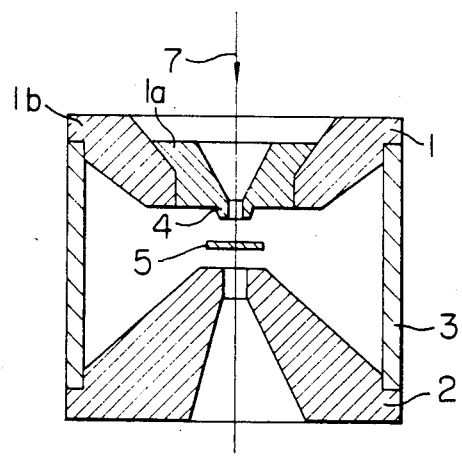
FIG. 2 is a longitudinal cross-sectional view of another embodiment of the invention.

The second embodiment shown in FIG. 2 differs from the first embodiment of FIG. 1 in that the X-ray conducting bore 6 shown in FIG. 1 does not exist, and the upper polepiece 1 is divided into a central polepiece section 1a and a peripheral polepiece section 1b with both sections being in close contact with each other detachably.

In the arrangement of FIG. 2, the electron beam on the electron beam axis 7 passes through the specimen 5, and the passing electron beam is deflected by the magnification lens system and projected on to the fluorescent screen (not shown). Thus, the electronic image of the sepcimen 5 can be observed on the fluorescent screen.

In the arrangement of FIG. 2, as in the case of FIG. 1, the upper polepiece has a fairly small lens bore, making it suitable for observation of a high resolution image. In addition, when the central polepiece section 1a is replaced with another central polepiece section having a lens bore large enough to take out X-rays, X-rays created by exposure of the specimen 5 to the electron beam can be detected though the lens bore in the upper polepiece.

If the protrudant lens bore portion 4 is absent, it is questionable in dividing the upper polepiece into the central and peripheral polepiece sections and fitting both sections detachably, since the contact of these sections cannot be made uniform to the order of a micron and this causes the astigmatism. Therefore, in the conventional structure, when the bore size of the upper polepiece needs to be changed for the switching between the high-resolution observation mode and the X-ray detection mode, the entirety of the upper polepiece must have been replaced. This replacement operation has needed a series of tedious readjustment procedures such as settings of the object diaphragm located between both polepieces, the contamination preventing diaphragm and the object stigmator.

On the other hand, according to the embodiment of FIG. 2, wherein the upper polepiece 1 is divided into the central polepiece section 1a and peripheral polepiece section 1b so that the former is mounted on the latter detachably, the high-resolution observation mode and the X-ray detection mode can be switched by replacement of the central polepiece section, and the above-mentioned tedious readjustment procedures are no longer be needed. This is made possible entirely by the presence of the protrudant lens bore portion which allows the negligence of the astigmatism in the structure of the upper polepiece divided into a central and peripheral polepiece sections, with the former being mounted on the latter detachably, even if the contact of both sections is not uniform to the order of a micron.

While there has been described preferred embodiments of the present invention, it will be apparent to those skilled in the art that changes and modifications may be made without departing from the essential spirit of the invention and the scope of the present invention is not limited by the foregoing embodiments.

We claim:

1. An electromagnetic lens polepiece structure comprising an upper polepiece having a lens bore and a lower polepiece confronting said upper polepiece and having a lens bore, wherein a lens bore portion of said upper polepiece protrudes from the adjacent surface of the upper polepiece which is integral with said polepiece toward the lens bore of said lower polepiece, and wherein the outer diameter of the tip of said protrudant lens bore portion is larger than the diameter of the associated lens bore, but smaller than or equal to a magnitude three times the diamter of said lens bore.

2. A polepiece structure according to claim 1, wherein said upper polepiece has an opening for taking out X-rays at a portion other than said protrudant lens bore portion.

3. An electromagnetic lens polepiece structure comprising an upper polepiece having a lens bore and a lower polepiece confrinting said upper polepiece and having a lens bore, a lens bore portion of said upper polepiece protruding from the adjacent surface of the upper polepiece which is integral with said polepiece in a tapered shape toward the lens bore of said lower polepiece, and wherein the outer diameter of the tip of said protrudant lens bore portion is larger than the diameter of the associated lens bore, but smaller than or equal to a magnitude three times the diameter of said lens bore.

4. A polepiece structure according to claim 3, wherein said upper polepiece has an opening for taking out X-rays at a portion other than said protrudant lens portion.

5. A polepiece structure according to claim 1, wherein the dimension of protrusion of said protrudant lens bore portion is larger than the outer diameter of the tip of said protrudant portion.

6. An electromagnetic lens polepiece structure comprising an upper polepiece having a lens bore, a lower polepiece confronting said upper polepiece and having a lens bore, and a nonmagnetic spacer for connecting said upper polepiece to said lower polepiece, a lens bore portion of said upper polepiece protruding in a tapered shape from the adjacent surface of the upper polepiece which is integral with said polepiece toward the lens bore of said lower polepiece, said upper polepiece having an opening for taking out X-rays at a portion other than said protrudant lens bore portion, and wherein the outer diameter of the tip of said protrudant lens bore portion is larger than the diameter of the associated lens bore, but smaller than or equal to a magnitude three times the diameter of said lens bore.

7. A polepiece structure according to claim 6, wherein the dimension of protrusion of said protrudant lens bore portion is larger than the outer diameter of the tip of said protrudant portion.

8. A polepiece structure according to claim 1, wherein said upper polepiece comprises a central polepiece section including said protrudant lens bore portion, and a peripheral polepiece section excluding said central polepiece section, said central polepiece section being in contact with said peripheral polepiece section detachably.

9. A polepiece structure according to claim 1 further comprising a nonmagnetic spacer for connecting said upper polepiece to said lower polepiece, said upper polepiece comprising a central polepiece section including said protrudant lens portion, and a peripheral polepiece section excluding said central polepiece section, said central polepiece section being in contact with said peripheral polepiece section detachably, the dimension of protrusion of said diameter of the tip of said protrudant portion.

10. A polepiece structure according to claim 3, wherein said upper polepiece comprises a central polepiece section including said protrudant lens bore portion, and a peripheral polepiece section excluding said central polepiece section, said central polepiece section being in contact with said peripheral polepiece section detachably.

11. A polepiece structure according to claim 3 further comprising a nonmagnetic spacer for connecting said upper polepiece to said lower polepiece, said upper polepiece comprising a central polepiece section including said protrudant lens portion, and a periperhal polepiece section excluding said central polepiece section, said central polepiece section being in contact with said peripheral polepiece section detachably, the dimension of protrusion of said protrudant lens bore portion being larger than the outer diameter of the tip of said protrudant portion.

12. An electromagnetic lens polepiece structure comprising an upper polepiece having a lens bore and a lower polepiece confronting said upper polepiece and having a lens bore, wherein a lens bore portion of said upper polepiece protrudes from the adjacent surface of the upper polepiece which is integral with said polepiece toward the lens bore of said lower polepiece.

* * * * *